US005290760A

United States Patent [19]

Grivon et al.

[11] Patent Number: 5,290,760

[45] Date of Patent: Mar. 1, 1994

[54] METHOD OF MANUFACTURING AN ELECTRICAL CONTACT FOR A SUPERCONDUCTIVE CERAMIC

[75] Inventors: Fernand Grivon, Saint Michel sur Orge; Jacques Bouthegourd, Sannois, both of France

[73] Assignee: GEC Alsthom SA, Paris, France

[21] Appl. No.: 893,036

[22] Filed: Jun. 3, 1992

[30] Foreign Application Priority Data

Jun. 4, 1991 [FR] France ............................... 91 06417

[51] Int. Cl.[5] ............................................. B05D 5/12

[52] U.S. Cl. ....................................... 505/1; 505/706; 427/62; 427/123; 427/125; 427/299

[58] Field of Search ...................... 505/1, 706; 427/62, 427/63, 299, 123, 125

[56] References Cited

U.S. PATENT DOCUMENTS 4,963,523 10/1990 Ekin et al. .............................. 505/1

FOREIGN PATENT DOCUMENTS 0009245 4/1980 European Pat. Off. .
142480 6/1980 Fed. Rep. of Germany .
3534886 4/1986 Fed. Rep. of Germany .

OTHER PUBLICATIONS

IEEE Transactions on Magnetics, vol. 27, No. 2, Mar. 1991, New York, US, pp. 1866–1869; F. Grivon et al.: "YBaCuO current lead for Helium temperature applications".

Journal of Applied Physics, vol. 65, No. 4, Feb. 15, 1989, New York, US, pp. 1792–1794; J. D. Katz et al.: "Low-resistivity, YBa2Cu307-to-silver electrical contacts by plasma spraying".

Journal of the Electrochemical Society, vol. 135, No. 5, May 1988, Manchester, New Hampshire, US, pp. 1309–1310; Y. Tzeng: "Fabrication of electrical contacts to YBa2Cu307-x superconductor by molten silver processing".

Soviet Technical Physics Letters, vol. 15, No. 5, 1989, New York, US, pp. 345–346; V. G. Bessergenev et al: "Electrical Properties of Ag-YBaCu307-x contacts at 20–800° C.".

Chemical Abstracts, vol. 94, No. 57, 1981, Columbus, Ohio, US; abstract No. 35356P, p. 307; column 1; & JP-A-8 086 183 (Tokyo Shibaura Electric Co) Jun. 28, 1980.

*Primary Examiner*—Roy King
*Attorney, Agent, or Firm*—Sughrue, Mion, Zinn, Macpeak & Seas

[57] ABSTRACT

A method of manufacturing an electrical contact between a current lead and a part made of a superconductive ceramic of the type $RBa_2Cu_3O_y$, where R designates a lanthanide chosen from Y, La, Nd, Sm, Eu, Gd, Ho, Er, Tm, Yb, and Lu, and where y lies in the range 6.9 to 7, in which method a layer of a material based on a silver-containing resin is deposited on said part, the part is dried, and is then heat treated in oxygen by being heated to a temperature greater than 900° C., and then cooled, with the temperature dwelling at 450° C. for a certain length of time corresponding to the phase during which said ceramic is reoxygenated.

4 Claims, 1 Drawing Sheet

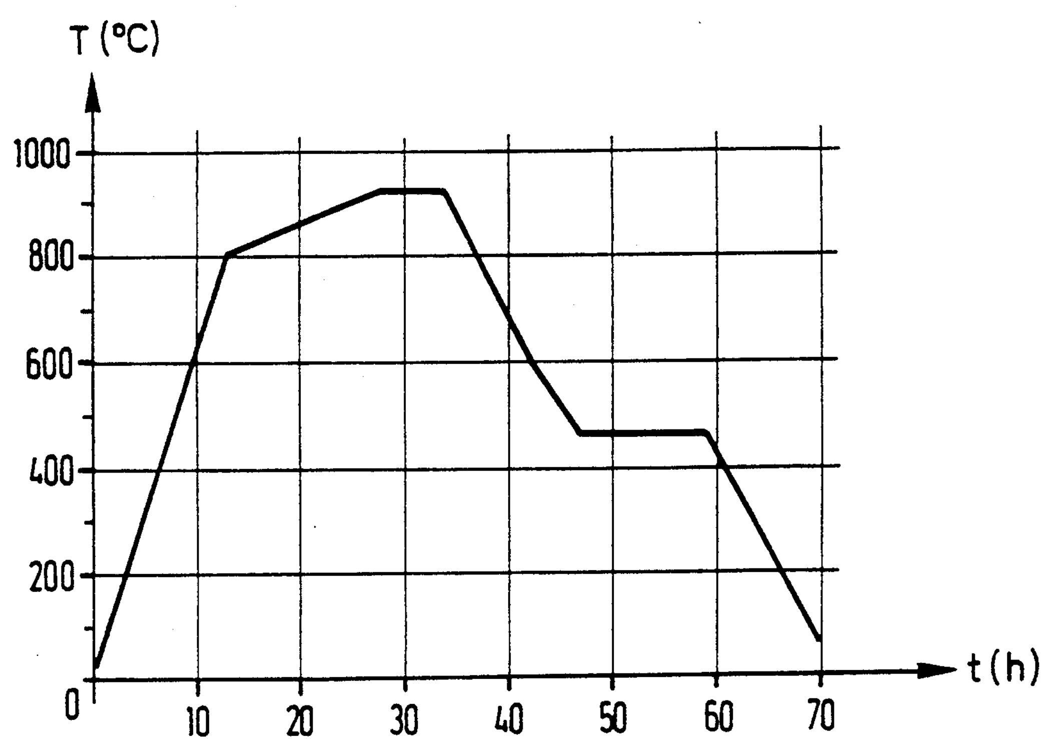
T (°C)
1000
800
600
400
200
0
10
20
30
40
50
60
70
t (h)

METHOD OF MANUFACTURING AN ELECTRICAL CONTACT FOR A SUPERCONDUCTIVE CERAMIC

FIELD OF THE INVENTION

The present invention relates to a method of manufacturing an electrical contact for a superconductive ceramic.

BACKGROUND OF THE INVENTION

It concerns manufacturing a low-resistance electrical contact between a current lead, generally made of copper, and a high critical temperature superconductive ceramic, of the type $RBa_2Cu_3O_y$, where R designates a lanthanide chosen from Y, La, Nd, Sm, Eu, Gd, Ho, Er, Tm, Yb, and Lu, and where y lies in the range 6.9 to 7.

Such a contact must allow high currents of the order of at least 1,000 A, and/or high current densities to flow therethrough.

The publication "YBaCuO current lead for liquid helium temperature applications" by F. Grivon et al. 1990 Applied Superconductivity Conference—Snowmass Colo., 24–28 Sept 90, mentions the following method.

A brush is used to apply a paint based on a silver-containing epoxy resin to a part made of a YBaCuO ceramic. After the painted part has been dried, it is subjected to heat treatment at high temperature in oxygen using the following cycle:

- heating to 800° C. at a rate of 60° C. per hour;
- heating to 930° C. at a rate of 10° C. per hour;
- maintaining the temperature stable for 6 hours;
- cooling to 450° C. at a rate of 30° C. per hour;
- maintaining the temperature stable at 450° C. for 12 hours corresponding to the phase during which the ceramic is reoxygenated; and
- cooling to ambient temperature at a rate of 30° C. per hour.

Among the results given in the above-mentioned publications, the lowest contact resistance per unit area measured at 77K is $1.7\times10^{-11}\ \Omega.m^2$ with a current of 550 amps.

An aim of the present invention is to provide a contact offering improved performance for even higher currents or current densities.

SUMMARY OF THE INVENTION

The present invention provides a method of manufacturing an electrical contact between a current lead and a part made of a superconductive ceramic of the type $RBa_2Cu_3O_y$, where R designates a lanthanide chosen from Y, La, Nd, Sm, Eu, Gd, Ho, Er, Tm, Yb, and Lu, and where y lies in the range 6.9 to 7, in which method a layer of a material based on a silver-containing resin is deposited on said part, the part is dried, and is then heat treated in oxygen by being heated to a temperature greater than 900° C., and then cooled, with the temperature dwelling at 450° C. for a certain length of time corresponding to the phase during which said ceramic is reoxygenated, said method being characterized by the fact that:

prior to depositing said layer, the surface of the relevant region is polished to roughness of less than 10 μm, and any grease is then removed therefrom;

said layer is deposited to a thickness lying in the range 2 μm to 10 μm and is made of a material based on a cross-linkable resin diluted with a heavy solvent in a concentration lying in the range 40% to 60% by weight, which solvent does not react with the ingredients of said resin, said material containing silver in a concentration lying in the range 30% to 45% by weight of the mixture formed by said resin and said solvent; and between the drying and the heat treatment, said resin is cross-linked by said part being put in an oven at about 100° C. for about 1 hour.

Said region may be polished until roughness of about 0.25 μm is obtained.

It can be observed that all the preceding operating conditions contribute to making a compact thin layer of silver, which layer is well bonded to the ceramic by grains of silver diffusing into the ceramic.

The risks of the layer coming away from the ceramic are reduced when the surface roughness of the ceramic is reduced, and when the resin containing the silver is diluted with a heavy solvent.

Such dilution, e.g. with butyl acetate, propyl propionate, or ethyl butyrate, makes the mixture less viscous, and enables a very thin layer to be made with an optimum area of real contact between the grains of silver and the ceramic.

Furthermore, once it has been cross-linked by being put in an oven at about 100° C. for at least 1 hour, the resin facilitates bonding the grains of silver onto the ceramic, and enables the subsequent heat treatment to be performed without disorganizing the layer of silver. The resin is consumed without going through a liquid phase, or emitting gaseous bubbles, and the resulting carbon-containing structure holds the grains of silver in place. This avoids cracks in the layer.

Preferably, during said heat treatment, said part is heated to a temperature lying in the range 940° C. to 960° C., and this temperature is maintained for not less than 3 hours. This treatment enables grains of silver to diffuse into the ceramic. The overall heat treatment is compatible with the superconductive properties of the ceramic.

Other characteristics and advantages of the present invention will appear on reading the following description of an embodiment given by way of non-limiting example.

BRIEF DESCRIPTION OF THE DRAWING

In the accompanying drawing, the sole figure shows the thermal cycle to which the part of the invention is subjected after deposition of the contact.

DESCRIPTION OF THE PREFERRED EMBODIMENT

The shape of said part is arbitrary. It may be analogous to the shape which is described in the above-mentioned publication by F. Grivon et al.

The contact-receiving region was prepared as follows. The region was polished by means of an abrasive which gave it roughness of about one micrometer, and then any grease was removed with a solvent, such as pure ethanol. Using a brush, the region was then coated with a material composed as follows (by weight):

4929 cross-linkable resin (DuPont de Nemours): 50 parts (including 37.5 parts of silver and 12.5 parts of organic products); and butyl acetate: 50 parts The thickness of the resulting deposited layer was of the order of 5 micrometers.

After being left to dry for a short time in air and at ambient temperature, the part was heated at 100° C. for one hour in an oven. It was then subjected to heat treatment in a pure oxygen atmosphere following the cycle shown in the accompanying sole figure (temperature T in °C as a function of time t in hours).

The resistances per unit area measured at 77K were as follows:

$10^{-13}$ Ω.m$^2$ for a current of 10 A; and $10^{-11}$ Ω.m$^2$ for a current of 1,000 A.

Naturally, the invention is not limited to the above-described embodiment. Any means may be replaced by equivalent means, or the durations of the different phases of the thermal cycle followed may be modified, without going beyond the ambit of the invention.

We claim:

1. In a method of manufacturing an electrical contact between a current lead and a part made of a superconductive $RBa_2Cu_3O_y$ ceramic where R designates a lanthanide selected from the group consisting of Y, La, Nd, Sm, Eu, Gd, Ho, Er, Tm, Yb, and Lu, and where y lies in the range 6.9 to 7, in which method a layer of a material based on a silver-containing resin is deposited on said part, the part is dried, and is then heat treated in oxygen by being heated to a temperature greater than 900° C., and then cooled, with the temperature dwelling at 450° C. for a length of time corresponding to a phase during which said ceramic is reoxygenated, the improvement wherein:

prior to depositing said layer, the surface of the part is polished to roughness of less than 10 μm, and any grease is then removed therefrom;

said layer is deposed to a thickness lying in the range of 2 μm to 10 μm and is made of a material based on a cross-linkable resin diluted with a solvent in a concentration lying in the range 40% to 50% by weight, which solvent does not react with the ingredients of said resin, said material containing silver in a concentration lying in the range 30% to 45% by weight of a mixture formed by said resin and said solvent; and between the drying and the heat treatment, said resin is cross-linked by said part being put in an oven at about 100° C. for about 1 hour.

2. A method according to claim 1, wherein said region is polished until roughness of about 0.25 μm is obtained.

3. A method according to claim 1, wherein during said heat treatment, said part is heated to a temperature lying in the range 940° C. to 960° C., and this temperature is maintained for not less than 3 hours.

4. A method according to claim 1, wherein said solvent is selected from the group consisting of butyl acetate, propyl propionate, and ethyl butyrate.

* * * * *